United States Patent [19]

Nagasaka et al.

[11] Patent Number: 5,738,974
[45] Date of Patent: Apr. 14, 1998

[54] PHOTOPOLYMERIZABLE COMPOSITION AND PHOTOSENSITIVE LITHOGRAPHIC PRINTING PLATE

[75] Inventors: Hideki Nagasaka; Toshiyuki Urano; Akihisa Murata, all of Yokohama, Japan

[73] Assignee: Mitsubishi Chemical Corporation, Tokyo, Japan

[21] Appl. No.: 520,724

[22] Filed: Aug. 29, 1995

[30] Foreign Application Priority Data

| Sep. 5, 1994 | [JP] | Japan | 6-211269 |
| Sep. 5, 1994 | [JP] | Japan | 6-211270 |
| Sep. 21, 1994 | [JP] | Japan | 6-227087 |
| Feb. 1, 1995 | [JP] | Japan | 7-015172 |

[51] Int. Cl.$^6$ ............................ G03F 7/029
[52] U.S. Cl. .................. 430/278.1; 430/281.1; 430/947; 430/926; 430/919; 430/920; 430/285.1; 522/14; 522/26
[58] Field of Search ............... 430/281.1, 947, 430/926, 919, 920, 278.1, 285.1; 522/14, 26

[56] References Cited

U.S. PATENT DOCUMENTS

| 5,011,755 | 4/1991 | Rohde et al. | 430/281.1 |
| 5,045,434 | 9/1991 | Yoshihara et al. | 430/281.1 |

FOREIGN PATENT DOCUMENTS

| 0 566 353 | 10/1993 | European Pat. Off. | |
| 63-22110 | 9/1988 | Japan . | |
| 3-223759 | 10/1991 | Japan . | |
| 3-239703 | 10/1991 | Japan . | |
| 4-184344 | 7/1992 | Japan | 430/947 |
| 5-289335 | 11/1993 | Japan . | |
| 6-148885 | 5/1994 | Japan . | |
| 6-192309 | 7/1994 | Japan . | |
| 6-301208 | 10/1994 | Japan | 430/281.1 |

OTHER PUBLICATIONS

English Translation of Japanese Kokai 4–184344 Already of Record Cited as Yamashita et al.

*Primary Examiner*—Cynthia Hamilton
*Attorney, Agent, or Firm*—Oblon, Spivak, McClelland, Maier & Neustadt, P.C.

[57] ABSTRACT

A photopolymerizable composition comprising an addition polymerizable compound having at least one ethylenically unsaturated double bond and a photopolymerization initiator system, wherein the photopolymerization initiator system comprises:

(a) a titanocene compound, and
(b) at least one coumarin compound of the following formula (I):

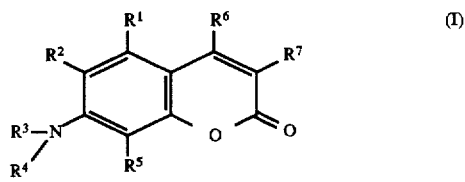

wherein (i) each of $R^1$, $R^2$ and $R^5$ is a hydrogen atom, a halogen atom, an alkyl group or an alkoxy group, each of $R^3$ and $R^4$ is an alkyl group, provided that at least one of $R^3$ and $R^4$ is a $C_{4-16}$ alkyl group, or (ii) $R^1$ is a hydrogen atom, a halogen atom, an alkyl group or an alkoxy group, and at least one set of $R^2$ and $R^3$, and $R^4$ and $R^5$, is connected to form an alkylene group substituted by a lower alkyl group, provided that when they do not form the connecting group, each of $R^2$ and $R^5$ is a hydrogen atom, a halogen atom, an alkyl group or an alkoxy group, and each of $R^3$ and $R^4$ is an alkyl group; $R^6$ is a hydrogen atom, an alkyl group, an alkoxy group, an acyl group, a cyano group, or a carboxyl group or a group of its ester derivative or amide derivative, and $R^7$ is a heterocyclic residue having a total number of carbon atoms of from 3 to 17.

10 Claims, No Drawings

PHOTOPOLYMERIZABLE COMPOSITION AND PHOTOSENSITIVE LITHOGRAPHIC PRINTING PLATE

The present invention relates to a photopolymerizable composition. Particularly, it relates to a photopolymerizable composition showing high sensitivity to light rays in the visible light range and having excellent dissolution stability, and a photosensitive lithographic printing plate.

Heretofore, a number of image forming methods have been known in which a photopolymerizing system is utilized. For example, there are a method wherein a photopolymerizable composition comprising an addition polymerizable compound containing an ethylenic double bond and a photopolymerization initiator, and optionally as an additional component an organic polymer binder, is prepared, this photopolymerizable composition is coated on a substrate to obtain a photosensitive material provided with a layer of the photopolymerizable composition, exposure of a desired image is conducted so that the exposed portion is polymerized and cured, and unexposed portion is then dissolved and removed to form a cured relief image; a method wherein a layer of a photopolymerizable composition is formed between a pair of substrates, at least one of which is transparent, exposure is conducted from the transparent substrate side so that a change in the bonding strength is created by the radiation, and then the substrate is peeled off to form an image; and a method wherein an image is formed by utilizing a change in the adhesion of a toner caused by radiation to a layer of a photopolymerizable composition. As the photopolymerization initiator of the photopolymerizable composition used in these methods, benzoin, benzoin alkyl ether, benzil ketal, benzophenone, anthraquinone, benzil or Michler's ketone has been employed. These photopolymerization initiators have an ability to initiate photopolymerization with light rays of short wavelength in the ultraviolet light range of at most 400 nm. However, their photopolymerization initiating ability with light rays in the visible light range of at least 400 nm is very low, which has limited the applicable range of the photopolymerizable compositions containing them.

In recent years, with the progress of image-forming techniques, there has been a strong demand for photopolymers highly sensitive to light rays in the visible light range. For example, they are photosensitive materials suitable for non-contact type projection exposure plate making or laser plate making by a visible ray laser. Among such techniques, a plate making system employing an oscillation beam of 488 nm of an argon ion laser is considered to be one of the most prospective techniques.

Heretofore, some proposals have been made with respect to photopolymerizable compositions containing a photopolymerization initiator system sensitive to light rays in the visible light range. For example, if an attention is drawn to the photopolymerization initiator system, there may be mentioned a system comprising a hexarylbiimidazole and a (p-dialkylaminobenzylidene) ketone (Japanese Unexamined Patent Publications No. 2528/1972, No. 155292/1979 and No. 166154/1981), a system comprising a ketocoumarin and an active agent (Japanese Unexamined Patent Publications No. 112681/1977, No. 15503/1983 and No. 88005/1985), a system comprising a substituted triazine and a sensitizer (Japanese Unexamined Patent Publications No. 151024/1979, No. 29803/1983 and No. 40302/1983), a system comprising biimidazole, a styrene derivative and thiol (Japanese Unexamined Patent Publication No. 56403/1984), a system comprising an organic peroxide and a dye (Japanese Unexamined Patent Publications No. 140203/1984 and No. 189340/1984), and a system comprising a titanocene and a sensitizer (Japanese Unexamined Patent Publications No. 221110/1988, No. 26154/1992 and No. 219756/1992). These conventional techniques are certainly effective to some extent however, their sensitivities are still inadequate from the practical viewpoint, and a further improvement has been desired.

As a sensitizing system for a visible light range employing a titanocene compound, a further system of combination with a coumarin compound of a specific structure having a heterocyclic ring has been proposed, whereby a certain level of effects is expected (Japanese Unexamined Patent Publications No. 239703/1991 and No. 289335/1993). However, this system has had some difficulties when it is to be applied, for example, to laser plate making. Namely, a system having higher sensitivity and good dissolution stability has been desired.

The present invention has been made to meet such demands. It is a first object of the present invention to provide a photopolymerizable composition excellent in dissolution stability.

The second object is to provide such a composition having adequate sensitivity.

Another object is to provide such a composition having excellent characteristics suitable for laser plate making.

The present inventors have found it possible to accomplish such objects by a certain specific composition as defined by the present invention.

Namely, the present invention provides a photopolymerizable composition comprising an addition polymerizable compound having at least one ethylenically unsaturated double bond and a photopolymerization initiator system, wherein the photopolymerization initiator system comprises:

(a) a titanocene compound, and (b) at least one coumarin compound of the following formula (I):

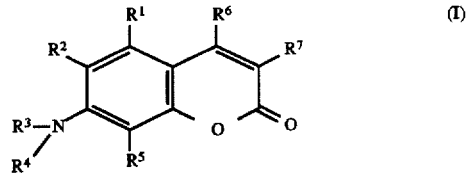

wherein (i) each of $R^1$, $R^2$ and $R^5$ is a hydrogen atom, a halogen atom, an alkyl group or an alkoxy group, each of $R^3$ and $R^4$ is an alkyl group, provided that at least one of $R^3$ and $R^4$ is a $C_{4-16}$ alkyl group, or (ii) $R^1$ is a hydrogen atom, a halogen atom, an alkyl group or an alkoxy group, and at least one set of $R^2$ and $R^3$, and $R^4$ and $R^5$, is connected to form an alkylene group substituted by a lower alkyl group, provided that when they do not form the connecting group, each of $R^2$ and $R^5$ is a hydrogen atom, a halogen atom, an alkyl group or an alkoxy group, and each of $R^3$ and $R^4$ is an alkyl group; $R^6$ is a hydrogen atom, an alkyl group, an alkoxy group, an acyl group, a cyano group, or a carboxyl group or a group of its ester derivative or amide derivative, and $R^7$ is a heterocyclic residue having a total number of carbon atoms of from 3 to 17.

The present invention also provides a photosensitive lithographic printing plate having such a photopolymerizable composition coated on a grained and anodized aluminum substrate.

Now, the present invention will be described in detail with reference to the preferred embodiments.

The addition polymerizable compound having at least one ethylenically unsaturated double bond (hereinafter referred to simply as "ethylenic compound") contained as a first essential component in the photopolymerizable composition of the present invention is a compound having an ethylenically unsaturated double bond, which is capable of undergoing addition polymerization and being cured by the action of the photopolymerization initiator system as a second essential component, when the photopolymerizable composition is irradiated with active light rays. For example, it may be a-monomer having such a double bond or a polymer having an ethylenically unsaturated double bond in its side chain or main chain. In the present invention, the monomer is meant for a substance as opposed to a so-called polymer substance and includes dimers, trimers and oligomers in addition to monomers in a narrow sense.

The monomer having an ethylenically unsaturated double bond includes, for example, an unsaturated carboxylic acid, an ester of an unsaturated carboxylic acid with an aliphatic polyhydroxy compound, an ester of an unsaturated carboxylic acid with an aromatic polyhydroxy compound and an ester obtained by the esterification reaction of an unsaturated carboxylic acid and a polybasic carboxylic acid with a polyhydroxy compound such as the above-mentioned aliphatic polyhydroxy compound or aromatic polyhydroxy compound.

The above-mentioned ester of an unsaturated carboxylic acid with an aliphatic polyhydroxy compound is not particularly limited and includes, as specific examples, acrylic acid esters of polyhydroxy compounds such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetracrylate, dipentaerythritol tetracrylate, dipentaerythritol pentacrylate, dipentaerythritol hexacrylate and glycerol acrylate; methacrylic acid esters corresponding to the above examples wherein "acrylate" is changed to "methacrylate"; itaconic acid esters corresponding to the above examples wherein "acrylate" is likewise changed to "itaconate"; crotonic acid esters corresponding to the above examples wherein "acrylate" is likewise changed to "crotonate"; and maleic acid esters corresponding to the above examples wherein "acrylate" is likewise changed to "maleate".

The ester of an unsaturated carboxylic acid with an aromatic polyhydroxy co pound includes, for example, hydroquinone diacrylate, hydroquinone dimethacrylate, resorcinol diacrylate, resorcinol dimethacrylate and pyrogallol triacrylate.

The ester obtained by the esterification reaction of an unsaturated carboxylic acid and a polybasic carboxylic acid with a polyhydroxy compound may not necessarily be a single compound. Typical specific examples include a condensation product of acrylic acid, phthalic acid and ethylene glycol, a condensation product of acrylic acid, maleic acid and diethylene glycol, a condensation product of methacrylic acid, terephthalic acid and pentaerythritol and a condensation product of acrylic acid, adipic acid, butane diol and glycerol.

Other than the above ester type (meth)acrylates, a so-called urethane type (meth)acrylate or an epoxy type (meth)acrylate may, for example, be mentioned. The former can be prepared by an addition reaction of a polyvalent isocyanate with a hydroxyacryl ester, and the latter can be prepared by an addition reaction of a polyvalent epoxy compound with a hydroxyacryl ester.

Other ethylenic compounds which may be used in the present invention include, for example, acrylamides such as ethylene bisacrylamide; allyl esters such as diallyl phthalate; and vinyl group-containing compounds such as divinyl phthalate.

The polymer having an ethylenically unsaturated double bond on the main chain includes, for example, a polyester obtained by the polycondensation reaction of an unsaturated dibasic carboxylic acid with a dihydroxy compound, and a polyamide obtained by the polycondensation reaction of an unsaturated dibasic carboxylic acid with a diamine. The polymer having an ethylenically unsaturated double bond at the side chain may be a condensation polymer of a dibasic carboxylic acid having an unsaturated bond at the side chain such as itaconic acid, propylidenesuccinic acid or ethylidenemalonic acid with a dihydroxy or diamine compound. Further, a polymer having a functional group having a reactivity such as a hydroxyl group or a halogenated methyl group in the side chain, such as a polymer obtained by a polymer reaction of e.g. polyvinyl alcohol, poly(2-hydroxyethyl methacrylate) or polyepichlorohydrin with an unsaturated carboxylic acid such as acrylic acid, methacrylic acid or crotonic acid, may also be suitable for use.

Among the above-mentioned ethylenic compounds, monomers of acrylic acid esters or methacrylic acid esters are particularly suitable for use. Particularly preferred among them is an acrylic acid ester or methacrylic acid ester of an aliphatic polyhydroxy compound.

Now, the photopolymerization initiator system as a second essential component of the photopolymerizable composition of the present invention will be described.

The photopolymerization initiator system of the present invention is a combination of at least two components. The first component is a titanocene compound which is represented by (a) in the present invention. The titanocene compound is not particularly limited and may, for example, be suitably selected for use from various titanocene compounds disclosed in Japanese Unexamined Patent Publications No. 152396/1984 and No. 151197/1986. More specifically, it includes titanium complexes having a di-cyclopentadienyl group, such as di-cyclopentadienyl-Ti-di-chloride, di-cyclopentadienyl-Ti-bis-phenyl, di-cyclopentadienyl-Ti-bis-2,3,4,5,6-pentafluorophenyl-1-yl, di-cyclopentadienyl-Ti-bis-2,3,5,6-tetrafluorophen-1-yl, di-cyclopentadienyl-Ti-bis-2,4,6-trifluorophen-1-yl, di-cylcopentadienyl-Ti-bis-2,6-di-fluorophen-1-yl, di-cyclopentadienyl-Ti-bis-2,4-di- fluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,6-difluorophen-1-yl, and di-cyclopentadienyl-Ti-bis-2,6-difluoro-3-(pyrr-1-yl)-phen-1-yl (hereinafter referred to as T-1).

Now, the photopolymerization initiator system of the second component (b) of the present invention will be described. This compound is a coumarin compound having a heterocyclic residue at the 3-position and a certain specific substituent at the 7-position.

In the art related to this compound, it has been reported that the one having a lower dialkylamino group, particularly a diethylamino group, at the 7-position, is preferred (Japanese Unexamined Patent Publication No. 239703/1991). However, such a diethylamino group-containing coumarin compound has a characteristic such that crystals are likely to deposit during the storage.

Whereas, from the various studies conducted by the present inventors, it has been found that a coumarin compound having a certain specific substituent at the 7-position has particularly excellent dissolution stability and high sensitivity.

Namely, such a coumarin compound is a compound of the above-mentioned formula (I) wherein (i) each of $R^1$, $R^2$ and $R^5$ is a hydrogen atom, a halogen atom, an alkyl group or an alkoxy group, each of $R^3$ and $R^4$ is an alkyl group, provided that at least one of $R^3$ and $R^4$ is a $C_{4-16}$ alkyl group, or (ii) $R^1$ is a hydrogen atom, a halogen atom, an alkyl group or an alkoxy group, and at least one set of $R^2$ and $R^3$, and $R^4$ and $R^5$, is connected to form an alkylene group substituted by a lower alkyl group, provided that when they do not form the connecting group, each of $R^2$ and $R^5$ is a hydrogen atom, a halogen atom, an alkyl group or an alkoxy group, and each of $R^3$ and $R^4$ is an alkyl group; $R^6$ is a hydrogen atom, an alkyl group, an alkoxy group, an acyl group, a cyano group, or a carboxyl group or a group of its ester derivative or amide derivative, and $R^7$ is a heterocyclic residue having a total number of carbon atoms of from 3 to 17.

In other words, the coumarin compound of the present invention is represented by the following formula (I):

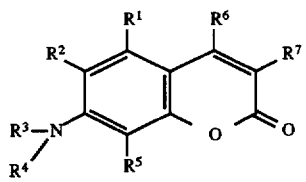

(I)

$R^1$: a hydrogen atom, a halogen atom, an alkyl group or an alkoxy group, $R^2$: a hydrogen atom, a halogen atom, an alkyl group or an alkoxy group, or a lower alkyl substituted alkylene group together with $R^3$ coupled each other $R^5$: a hydrogen atom, a halogen atom, an alkyl group or an alkoxy group, or a lower alkyl substituted alkylene group together with $R^4$ coupled each other $R^3$: an alkyl group or a lower alkyl substituted alkylene group together with $R^2$ coupled each other $R^4$: an alkyl group or a lower alkyl substituted alkylene group together with $R^5$ coupled each other $R^6$: a hydrogen atom, an alkyl group, an alkoxy group, an acyl group, a cyano group or a carboxyl group or its ester derivative or amide derivative, $R^7$: a $C_{3-17}$ heterocyclic residue, wherein, when both of $R^3$ and $R^4$ are an alkyl group, at least one of $R^3$ and $R^4$ is a $C_{4-16}$ alkyl group.

When $R^1$, $R^2$ or $R^5$ is a halogen atom, such a halogen atom is preferably a chlorine atom, a bromine atom or an iodine atom. When $R^1$, $R^2$, $R^5$ or $R^6$ is an alkyl group or an alkoxy group, it is preferably a lower alkyl group or a lower alkoxy group, more preferably a $C_{1-4}$ alkyl group or a $C_{1-4}$ alkoxy group, from the viewpoint of the synthesis.

When $R^6$ is an acyl group, it is preferably an alkylcarbonyl group having a total number of carbon atoms of from 2 to 5. When it is an ester derivative of a carboxyl group, it may, for example, be a $C_{1-12}$ alkyl ester group. Likewise, when it is an amide derivative, it may, for example, be a $C_{1-12}$ alkylamide or anilide.

Each of $R^1$, $R^2$, $R^5$ and $R^6$ is preferably a hydrogen atom or a lower alkyl group.

$R^7$ is not particularly limited so long as it is a heterocyclic residue having a total number of carbon atoms of from 3 to 17. It is preferably a nitrogen-containing aromatic heterocyclic residue, more preferably a fused ring-type nitrogen-containing aromatic heterocyclic residue having a total number of carbon atoms of from 3 to 11. Specifically, a benzothiazolyl group, a benzoxazolyl group or a benzimidazoyl group may, for example, be mentioned. The coumarin compound of the present invention is characterized by substituents $R^3$ and $R^4$. Firstly, at least one set of $R^3$ and $R^2$, and $R^4$ and $R^5$, is connected to form an alkylene group substituted by a lower alkyl group. Here, the lower alkyl group is preferably a $C_{1-2}$ alkyl group, and the carbon number of the connecting chain of the alkylene group (i.e. the carbon number of the linear portion) is usually from 2 to 4, preferably 3. Particularly preferred is a 1,1-dialkyl-1,3-propylene group, wherein the alkyl group as the substituent is preferably a methyl group. Further preferred is that the carbon atom of the 3-position is bonded to nitrogen.

In a case where one set of $R^2$ and $R^3$, and $R^4$ and $R^5$ is not connected to form an alkylene group, one of $R^2$ and $R^5$ is a hydrogen atom, a halogen atom, an alkyl group or an alkoxy group as described above, and one of $R^3$ and $R^4$ is an alkyl group, preferably a $C_{1-10}$ alkyl group, more preferably $C_{2-8}$ alkyl group. Especially one of $R^2$ and $R^5$ is a hydrogen atom or a $C_{1-4}$ alkyl group.

Now, the method for producing the compound having such substituents will be described.

Introduction of such substituents can be accomplished by condensation addition of 1-chloro-3,3-dialkyl-2-propene to m-aminophenol, as disclosed in e.g. U.S. Pat. No. 4,736,032. The intermediate tetraalkyl-substituted 8-hydroxyjulolidine thus obtained can readily be led to the compound (I) of the present invention in accordance with a conventional method.

For example, it can be prepared by the following route.

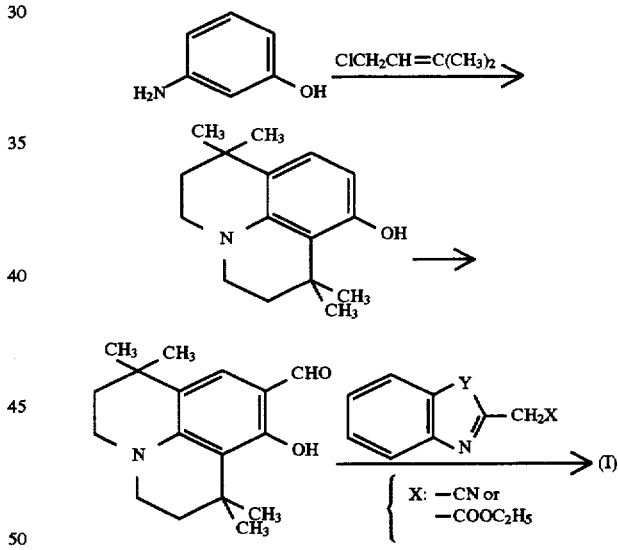

Now, typical examples will be given for the compound of the formula (I) wherein at least one set of $R^2$ and $R^3$, and $R^4$ and $R^5$, is connected to form an alkylene group substituted by an alkyl group. However, it should be understood that these examples are merely illustrative and not restrictive.

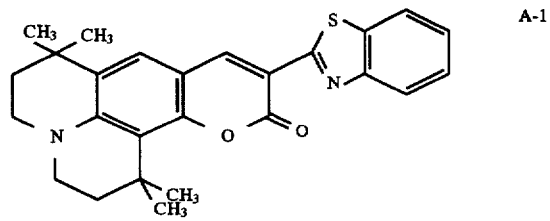

A-1

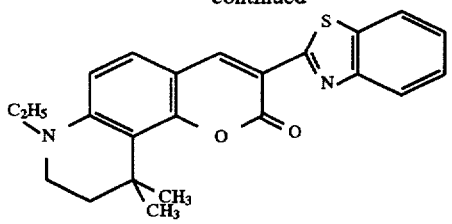

A-2

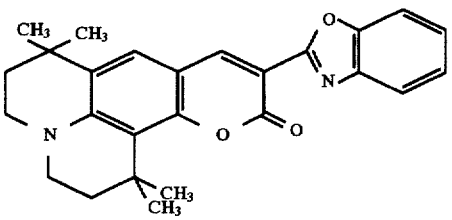

A-3

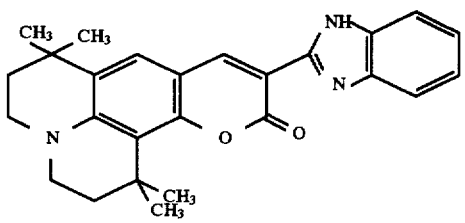

A-4

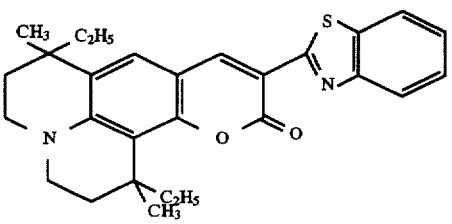

A-5

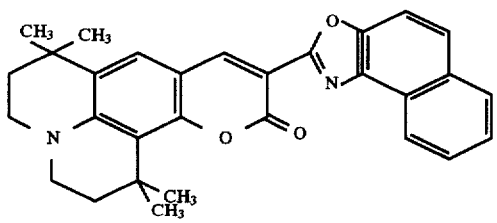

A-6

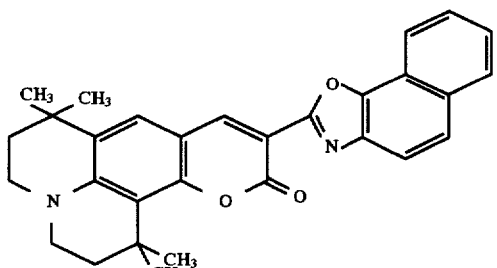

A-7

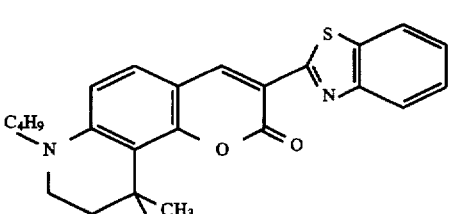

A-8

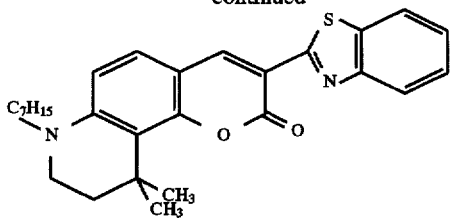

A-9

Among these compounds, preferred is the one having a structure wherein the amino group at the 7-position is a 1,1-dimethyl-1,3-propylene group.

On the other hand in a case where both off substituents $R^3$ and $R^4$ do not form a ring at least one of them is a $C_{4-16}$ alkyl group. In this case synthesis will be easy and preferred as compared with the case where the substituents form a ring. Further it is preferred that both alkyl groups have a carbon number within this range. More preferably, they are $C_{5-12}$ alkyl groups. If the carbon numbers of both alkyl groups are outside the above range, the solubility may be low and the compound is likely to precipitate from the photosensitive layer, such being undesirable.

Here, the alkyl groups may be linear or branched. However, a combination of linear and branched alkyl groups is preferred, since the solubility is thereby further improved.

Now, specific examples will be given for a coumarin compound of the formula (I) wherein $R^2$ and $R^3$, and $R^4$ and $R^5$, do not form a connecting group. However, it should be understood that these examples are merely illustrative and not restrictive.

Unless otherwise specifically indicated, each of substituents $R^1$, $R^2$, $R^5$ and $R^6$ is a hydrogen atom, and $R^7$ is a 2-benzothiazolyl group.

B-1: $R^3=R^4$=n-amyl
B-2: $R^3=R^4$=n-hexyl
B-3: $R^3=R^4$=n-heptyl
B-4: $R^3=R^4$=n-octyl
B-5: $R^3=R^4$=n-decyl
B-6: $R^3=R^4$=n-dodecyl
B-7: $R^3=R^4$=2-ethylhexyl
B-8: $R^3$=n-hexyl, $R^4$=ethyl
B-9: $R^3=R^4$=4-hydroxybutyl
B-10: $R^3$=n-amyl, $R^4$=4-methoxybutyl
B-11: $R^3=R^4$=n-heptyl; $R^6$=carboethoxy
B-12: $R^3=R^4$=n-octyl; $R^7$=2-benzoxazolyl
B-13: $R^3=R^4$=n-hexyl; $R^7$=2-naphtho(1,2-d)oxazolyl
B-14: $R^3=R^4$=n-hexyl; $R^7$=2-naphtho(2,1-d)oxazolyl
B-15: $R^3=R^4$=n-octyl; $R^7$=2-benzimidazolyl
B-16: $R^3$=n-butyl; $R^4$=n-octyl
C-1: $R^3$=2-ethylhexyl, $R^4$=n-octyl
C-2: $R^3$=2-ethylhexyl, $R^4$=n-butyl
C-3: $R^3$=2-ethylhexyl, $R^4$=ethyl
C-4: $R^3$=2-ethylhexyl, $R^4$=n-butyl, $R^7$=2-benzoxazolyl
C-5: $R^3$=3-octyl, $R^4$=n-octyl
C-6: $R^3$=3-heptyl, $R^4$=ethyl
C-7: $R^3$=2-hexyl, $R^4$=n-butyl
C-8: $R^3$=2-pentyl, $R^4$=n-hexyl
C-9: $R^3$=sec-butyl, $R^4$=n-pentyl
C-10: $R^3$=i-propyl, $R^4$=n-hexyl
C-11: $R^3$=2-ethylhexyl, $R^4$=n-butyl, $R^7$=2-benzimidazolyl The other examples of a coumarin compound of the formula (I) include, for example, the similar compound of from B-1 to B-16 and from C-1 to C-11 except that $R^7$ is changed to 2-benzothiazolyl group, 2-benzoxazolyl or 2-benzimidazolyl.

Further, the other examples of a coumarin compound of the formula (I) include, for example, the similar compound of from B-1 to B-16 and from C-1 to C-11 except that at least one of $R^1$, $R^2$, $R^5$ and $R^6$ is changed to methyl group.

These compounds can be readily prepared in accordance with a conventional method such as the method disclosed in the above-mentioned literature.

When these compounds are to be used for the composition of the present invention, there is no problem even if a certain amount of impurities (such as dialkylamino derivatives with linear or branched alkyl groups, etc.) formed as by-products during the synthesis may be included.

Now, a compound of the third component (c) which may optionally be used in the photopolymerization initiation system of the present invention will be described. This component is intended to improve e.g. the sensitivity characteristics, and one or more compounds are selected for use among compounds of the following formulas (II), (III) and (IV):

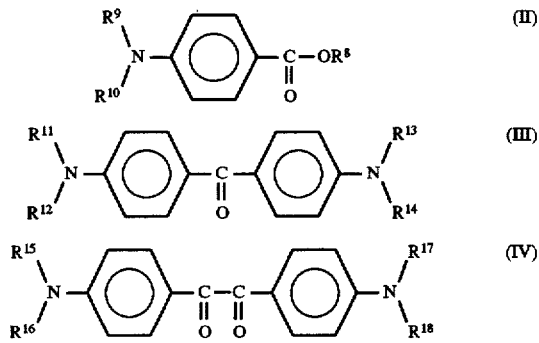

wherein each of $R^8$ to $R^{18}$ is an alkyl group.

In the formulas (II) to (IV), each of $R^8$ to $R^{18}$ is an alkyl group. However, each of $R^9$ to $R^{18}$ is preferably a $C_{1-4}$ alkyl group, and $R^8$ is more specifically a $C_{1-20}$ alkyl group, preferably a $C_{1-10}$ alkyl group, more preferably a $C_{1-4}$ alkyl group, and such an alkyl group may be linear or branched. The alkyl group for $R^8$ may further have a substituent such as a halogen atom, an aryl group, an acyl group, a carboxyl group or an alkoxy group.

Specific examples of the compounds of the formulas (II) to (IV) include a dialkylaminobenzoic acid alkyl ester such as p-dimethylaminobenzoic acid ethyl ester (hereinafter referred to simply as P-1), p-diethylaminobenzoic acid ethyl ester, p-dimethylaminobenzoic acid isopropyl ester, p-dimethylaminobenzoic acid n-butyl ester, p-dimethylaminobenzoic acid n-octyl ester or p-di-n-butylaminobenzoic acid ethyl ester; a bisaminobenzophenone such as 4,4'-bis(dimethylamino)benzophenone (hereinafter referred to simply as P-2), 4,4'-bis (diethylamino)benzophenone or 4,4'-bis(diisopropylamino) benzophenone; and a bisaminobenzil such as 4,4-bis (dimethylamino)benzil (hereinafter referred to simply as P-3) or 4,4'-bis(diethylamino)benzil. Among them, a dialkylaminobenzoic acid alkyl ester is particularly preferred.

With respect to the amounts of components (a) and (b) of the photopolymerization initiator system of the present invention, it is preferred that component (a) is from 0.2 to 40 wt %, and component (b) is from 0.1 to 20 wt %, relative to the ethylenic compound. The amount of component (c) which may optionally be used, is preferably within a range of from 0.1 to 40 wt % relative to the ethylenic compound. Particularly preferred amounts are such that component (a) is from 1 to 30 wt %, component (b) is from 0.5 to 15 wt %, and component (c) is from 1 to 30 wt %, relative to the ethylenic compound.

The photopolymerizable composition of the present invention may preferably contain, in addition to the above described respective constituting components, an organic polymer material as a binder to modify the composition or to improve the physical properties after the photocuring. The binder may suitably be selected depending upon the particular purpose for improvement, such as compatibility, film-forming ability, developing property or adhesive property. Specifically, for the purpose of improving the aqueous developing property, an acrylic acid copolymer, a methacrylic acid copolymer, an iraconic acid copolymer, a partially esterified maleic acid copolymer, an acidic cellulose modified product having a carboxyl group in its side chain, a polyethylene oxide or a polyvinyl pyrrolidone may, for example, be mentioned. For the purpose of improving the film strength and adhesive property, a polyether of epichlorohydrin with bisphenol A; a soluble nylon; a polyalkyl methacrylate such as polymethyl methacrylate or a polyalkyl acrylate; a copolymer of an alkyl methacrylic acid with acrylonitrile, acrylic acid, methacrylic acid, vinyl chloride, vinylidene chloride or styrene; a copolymer of acrylonitrile with vinyl chloride or vinylidene chloride; a copolymer of vinylidene chloride, chlorinated polyolefin, vinyl chloride and vinyl acetate; polyvinyl acetate; a copolymer of acrylonitrile with styrene; a copolymer of acrylonitrile with butadiene or styrene; a polyvinylalkyl ether; a polyvinylalkyl ketone; a polystyrene; a polyamide; a polyurethane; a polyethylene terephthalate isophthalate; acetyl cellulose, or polyvinyl butyral may, for example, be mentioned.

Such a binder may be incorporated usually in a weight ratio within a range of at most 500%, preferably at most 200%, relative to the ethylenic compound.

The photopolymerizable composition of the present invention may further contain a thermal polymerization inhibitor, a coloring agent, a plasticizer, a surface-protective agent, a leveling agent, a coating assistant and other additives, as the case requires.

The thermal polymerization inhibitor may, for example, be hydroquinone, p-methoxyphenol, pyrogallol, catechol, 2,6-di-t-butyl-p-cresol or β-naphtol. The coloring agent may, for example, be a pigment such as a phthalocyanin-type pigment, an azo-type pigment, carbon black or titanium oxide, ethyl violet, crystal violet, an azo-type dye, an anthraquinone-type dye or a cyanin-type dye. The amounts of the thermal polymerization inhibitor and the coloring agent, when the above-described binder is used, are such that the thermal polymerization inhibitor is from 0.01 to 5% by weight, and the coloring agent is from 0.1 to 40% by weight, based on the total weight of the ethylenic compound and the binder.

The plasticizer may, for example, be dioctyl phthalate, didodecyl phthalate, triethylene glycol dicaprilate, dimethyl glycol phthalate, tricredyl phosphate, dioctyl adipate, dibutyl cebacate or triacetyl glycerol. When the binder is used, such a plasticizer may be added in an amount of at most 30% by weight based on the total weight of the ethylenic compound and the binder.

When the photopolymerizable composition of the present invention is to be used, it may be formed into a photosensitive material without using any solvent, or it may be solved in a suitable solvent to form a solution, which is then coated and dried on a substrate to obtain a photosensitive material. The solvent may, for example, be methyl ethyl ketone, cyclohexanone, butyl acetate, amyl acetate, methyl lactate, toluene, xylene, monochlorobenzene, carbon tetrachloride, trichloroethylene, trichloroethane, dimethylformamide, methyl cellosolve, ethyl cellosolve, tetrahydrofuran, benzoquinone or propylene glycol methyl ether acetate. These solvents may be used alone or in combination as a mixture of two or more of them.

The substrate to be used for preparing a photosensitive material using the photopolymerizable composition of the present invention may be any substrate which is commonly used or this purpose. For example, it may be a sheet of a metal such as aluminum, magnesium, copper, zinc, chromium, nickel or iron or an alloy containing such a metal as the main component; a paper material such as high quality paper, art paper or release paper; an inorganic sheet such as a glass sheet or a ceramics sheet; or a polymer sheet of e.g. polyethylene terephthalate, polyethylene, polymethyl methacrylate, polyvinyl chloride, a vinyl chloride-vinylidene chloride copolymer, polystyrene, 6nylon, cellulose triacetate or cellulose acetate butyrate.

Further, a conventional technique to prevent adverse effects of oxygen such as deterioration of the sensitivity or deterioration of the storage stability, may be applied to the photopolymerizable composition of the present invention. For example, a transparent cover sheet which is releasable may be provided on the photosensitive layer, or a coating layer of e.g. a wax-like substance having low oxygen permeability or a water-soluble polymer, may be formed on the photosensitive layer.

There is no particular restriction as to the light source for radiation applicable to the composition of the present invention. A commonly employed light source containing visible light rays of at least 400 nm may suitably be used, such as a carbon arc, a high pressure mercury lamp, a xenon lamp, a metal halide lamp, a fluorescent lamp, a tungsten lamp, a helium-cadmium laser, an argon ion laser o a YAG laser.

The photopolymerizable composition of the present invention is highly sensitive and at the same time excellent in the oleophilicity and the dissolution stability. Accordingly, the composition is useful in a wide range of application fields. For example, it is useful for the preparation of a printing plate for e.g. lithography, intaglio printing or relief printing, far a photoresist or a dry film for the preparation of printed circuits or integrated circuits, for the formation of images such as relief images or image reproduction, for photocurable inks, paints, and adhesives. Thus, it is industrially very useful.

Now, the present invention will be described in further detail with reference to Reference Examples, Examples and Comparative Examples. However, it should be understood that the present invention is by no means restricted to such specific Examples.

REFERENCE EXAMPLE 1

(Preparation of coumarin compound C-1)

3.3 g of 3-aminophenol, 7.0 g of 2-ethylhexyl bromide and 2.0 g of calcium carbonate powder were mixed together with 10 g of dimethylformamide and reacted in a nitrogen atmosphere at 120° C. for 2 hours. Then, 6.4 g of n-octyl bromide was added to the reaction system, and the reaction was further continued for 5 hours under the above conditions. After the reaction, the reaction mixture was returned to room temperature and extracted with toluene to obtain 3-(N-octyl-N-2-ethylhexyl)aminophenol. Then, 11 g of phosphorus oxychloride was added to 13 g of dimethylformamide and stirred for one hour at a temperature of not higher than 15° C., and then the above aminophenol derivative was dropwise added and mixed thereto, and the reaction was carried out at a reaction temperature of 70° C. for 1.5 hours. The reaction product was returned to room temperature, and then put into water containing 8.6 g of sodium hydroxide to obtain a corresponding salicylaldehyde derivative. Then, into 20 g of ethanol, 4.0 g of 2-benzothiazolylacetic acid ethyl ester, 7.7 g of the above salicylaldehyde derivative and 0.5 g of piperidine were mixed and dissolved and reacted at 80° C. for one hour to obtain the desired product as yellowish orange crystals.

Coumarin compounds R-1, R-2 and R-3 used in Comparative Examples given hereinafter, are compounds of the following formulas:

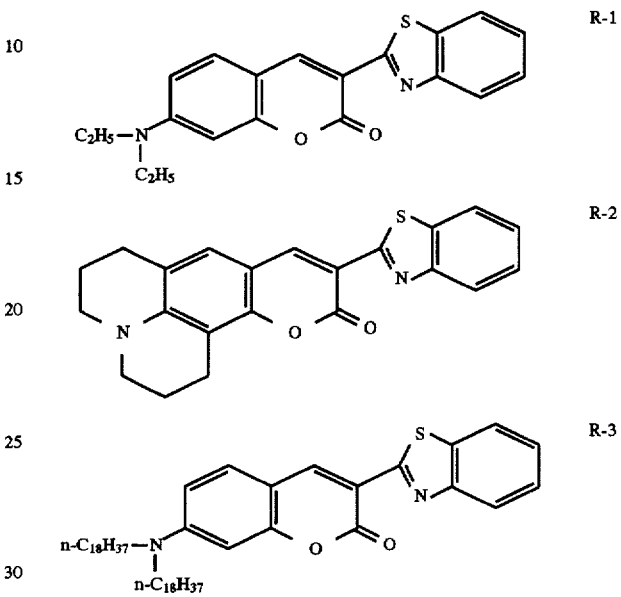

The sensitivity, the dissolution stability in a photosensitive layer and the contact angle, used in the following Examples, were evaluated by the following methods.

Sensitivity

A photosensitive test sample was exposed for 10 seconds by a spectral sensitivity measuring apparatus manufactured by Narumi K.K. using a xenon lamp UI-501C manufactured by Ushio Denki K.K. so that the light intensity weakened logarithmically with the abscissa representing a wavelength and the ordinate representing the light intensity. The exposed test sample was developed by an aqueous solution containing 6 wt % of butyl cellosolve and 1 wt % of sodium silicate. From the height of the obtained cured image corresponding to each wavelength, the minimum dose required for the formation of the photocured image was calculated and represented as the sensitivity of the photosensitive composition. Here, the sensitivity was, in all cases, represented by an energy corresponding to light rays of 488 nm.

Dissolution stability

A photosensitive test sample was left to stand at room temperature (22° to 25° C.) for a predetermined period of time, whereupon the deposition state of the initiator component was visually observed and evaluated under such evaluation standards that "good" means no deposition observed, "poor" means partial deposition observed, and "bad" means deposition observed over the entire surface.

Contact angle

The ink-affinity or the oleophilicity was determined by measuring the contact angle to water. Namely, a photosensitive test sample was irradiated over the entire surface with an exposure dose to give solid of 6 steps, followed by development and drying to obtain a solid image test specimen. This specimen was set in a contact angle meter (CA-D Model, manufactured by Kyowa Kaimen Kagaku K.K.), and the contact angle θ to water was measured. The larger the value of this θ, the higher the oleophilicity.

EXAMPLE 1

2 g of a methyl methacrylate/methacrylic acid copolymer (weight average molecular weight: 45,000, weight ratio: 85/15) and 2 g of trimethylolpropane triacrylate were dissolved in 36 g of methyl ethyl ketone. To this solution, components of the photopolymerization initiator system i.e. 80 mg of titanocene compound T-1 of component (a) and 80 mg of coumarin compound A-1 of component (b) were added and dissolved, to obtain a sample photosensitive solution.

This solution was whirl-coated on a grained and anodized aluminum sheet so that the dried film thickness would be 2 μm. Further, an aqueous polyvinyl alcohol solution was coated on its surface so that the dried film thickness would be 3 μm, to obtain a photosensitive test sample.

The evaluation results of this photosensitive test sample are shown in Table 1.

EXAMPLES 2 to 4 and COMPARATIVE EXAMPLE 1 and 2

Photosensitive test samples were prepared in the same manner as in Example 1, except that the coumarin compound was changed to the one identified in Table 1. The evaluation results of these photosensitive test samples are also indicated in Table 1.

TABLE 1

| | Coumarin compound | Initial sensitivity (μJ/cm$^2$) | Dissolution stability (evaluated after storage at room temperature for 4 months) |
|---|---|---|---|
| Example 1 | A-1 | 65 | O |
| Example 2 | A-2 | 90 | O |
| Example 3 | A-3 | 78 | O |
| Example 4 | A-4 | 85 | O |
| Comparative Example 1 | R-1 | 100 | X |
| Comparative Example 2 | R-2 | 60 | X |

In the above Table, O means that there was no change in the sensitivity, and no abnormality was observed on the appearance of the test sample, X means that deposition of crystals of the coumarin compound was observed, thus indicating that the yellow color of the photosensitive layer underwent discoloration, and deterioration of the sensitivity was partially observed.

EXAMPLES 5 to 11

Photosensitive test samples were prepared in the same manner as in Example 1, except that the coumarin compound was changed to the one identified in Table 2, and 200 mg of the compound as identified in Table 2 was added as component (c). The initial sensitivities of the photosensitive test samples are shown in Table 2. The samples of Examples 5 and 9 were left to stand at room temperature for 4 months, whereupon the sensitivity was measured, whereby there was no change in the sensitivity, and no change on the appearance was observed.

TABLE 2

| | Coumarin compound | Component C | Initial sensitivity (μJ/cm$^2$) |
|---|---|---|---|
| Example 5 | A-1 | P-1 | 38 |
| Example 6 | A-1 | P-2 | 50 |
| Example 7 | A-1 | P-3 | 53 |
| Example 8 | A-2 | P-1 | 47 |
| Example 9 | A-3 | P-1 | 43 |
| Example 10 | A-3 | P-2 | 47 |
| Example 11 | A-4 | P-1 | 52 |

EXAMPLE 12

1.8 g of a methyl methacrylate/methacrylic acid copolymer (weight average molecular weight: 45,000, weight ratio: 85/15) and 2.2 g of trimethylolpropane triacrylate were dissolved in 36 g of methyl ethyl ketone. To this solution, components of the photopolymerization initiator system, i.e. 80 mg of titanocene compound T-1 of component (a) and 80 mg of coumarin compound B-1 of component (b) were added and dissolved to obtain a sample photosensitive solution. This solution was whirl-coated on a grained and anodized aluminum sheet so that the dried film thickness would be 2 μm, and an aqueous polyvinyl alcohol solution was further coated on its surface so that the dried film thickness should be 3 μm, to obtain a photosensitive test sample.

The initial sensitivity was 90 μJ/cm$^2$, and the same sensitivity was maintained over a period of 2 months at room temperature, and the dissolution stability was also good. The image formed by exposure at the same time showed good image properties without any abnormality.

COMPARATIVE EXAMPLE 3

Evaluation was carried out in the same manner as in Example 12, except that coumarin compound B-1 was changed to R-1. The initial sensitivity was 95 μJ/cm$^2$, but upon expiration of 2 months at room temperature, the dissolution stability became poor, and the sensitivity became also poor to present an inferior image with irregularities.

EXAMPLES 13 to 25 and COMPARATIVE EXAMPLES 4 and 5

Preparation of the samples and evaluation were carried out in the same manner as in Example 12, except that the compound as identified in Table 3 was used as the coumarin compound, and 400 mg of p-dimethylaminobenzoic acid ethyl ester was further added. The results are shown in Table 3.

TABLE 3

| | Coumarin compound | Initial sensitivity (μJ/cm$^2$) | Dissolution stability (evaluated after storage at room temperature for 2 months) | Contact angle (°) |
|---|---|---|---|---|
| Example 13 | B-1 | 38 | Good | 61.8 |
| Example 14 | B-3 | 40 | Good | 62.6 |
| Example 15 | B-4 | 38 | Good | 63.3 |
| Example 16 | B-5 | 44 | Good | 65.2 |
| Example 17 | B-6 | 42 | Good | 66.0 |
| Example 18 | B-12 | 55 | Good | — |
| Example 19 | B-15 | 89 | Good | — |

TABLE 3-continued

|  | Coumarin compound | Initial sensitivity ($\mu J/cm^2$) | Dissolution stability (evaluated after storage at room temperature for 2 months) | Contact angle (°) |
|---|---|---|---|---|
| Example 20 | B-7 | 47 | Good | — |
| Example 21 | B-16 | 45 | Good | — |
| Example 22 | C-1 | 43 | Good | — |
| Example 23 | C-2 | 45 | Good | — |
| Example 24 | C-3 | 43 | Good | — |
| Example 25 | C-4 | 52 | Good | — |
| Comparative Example 4 | R-1 | 44 | Bad | 59.5 |
| Comparative Example 5 | R-3 | 200 or more | Bad | Not measurable |

EXAMPLES 26 to 32 and COMPARATIVE EXAMPLE 6

Preparation of the samples and evaluation were carried out in the same manner as in Example 12, except that $2 \times 10^{-4}$ mol of the compound identified in Table 4 was used as the coumarin compound, and 400 mg of p-dimethylaminobenzoic acid ethyl ester was further added. The results are shown in Table 4.

TABLE 4

|  | Coumarin compound | Initial sensitivity ($\mu J/cm^2$) | Dissolution stability (evaluated after storage at room temperature for 2 months) | Contact angle (°) |
|---|---|---|---|---|
| Example 26 | B-1 | 39 | Good | 62.0 |
| Example 27 | B-3 | 41 | Good | 62.2 |
| Example 28 | B-4 | 36 | Good | 64.0 |
| Example 29 | B-5 | 43 | Good | 64.7 |
| Example 30 | B-6 | 41 | Good | 67.3 |
| Example 31 | B-12 | 57 | Good | — |
| Example 32 | B-15 | 95 | Good | — |
| Comparative Example 6 | R-1 | 43 | Poor | 59.8 |

EXAMPLES 33 to 36, REFERENCE EXAMPLES 2 to 4 and COMPARATIVE EXAMPLE 7

To examine the storage stability of the coumarin compound under severer conditions, the following test was carried out.

Namely, 300 mg (corresponding to 6 wt %) of a coumarin compound was added to 5 g of a liquid acrylic acid ester monomer (A-BPE4, manufactured by Shinnakamura Kagaku K.K.), followed by heating and dissolving at 100° C. Then, the solution was returned to room temperature and left to stand still to observe the deposition of crystals of the coumarin compound. The solubility was evaluated under such evaluation standards that X means that the deposition initiation time is less than 20 hours, Δ means that the deposition initiation time is at least 20 hours and less than 60 hours, ○ means that the deposition initiation time is at least 60 hours and less than 100 hours, and ⊙ means that the deposition initiation time is at least 100 hours. The results are shown in Table 5.

TABLE 5

|  | Coumarin compound | Solubility |
|---|---|---|
| Example 33 | C-1 | ⊙ |
| Example 34 | C-2 | ⊙ |
| Example 35 | C-3 | ⊙ |
| Example 36 | C-4 | ⊙ |
| Reference Example 2 | B-4 | Δ |
| Reference Example 3 | B-16 | ○ |
| Reference Example 4 | B-7 | Δ |
| Comparative Example 7 | R-1 | X |

We claim:

1. A photosensitive lithographic printing plate having the photopolymerizable composition comprising an addition polymerizable compound having at least one ethylenically unsaturated double bond and a photopolymerization initiator system, wherein the photopolymerization initiator system consists essentially of:

(a) titanocene compound, and (b) at least one coumarin compound of the following formula (I):

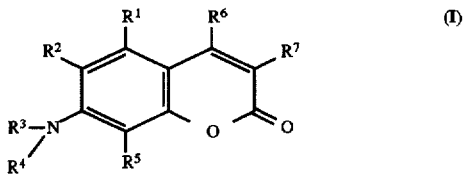

wherein (i) each of $R^1$, $R^2$ and $R^5$ is a hydrogen atom, a halogen atom, an alkyl group or an alkoxy group, each of $R^3$ and $R^4$ is an alkyl group, provided that at least one of $R^3$ and $R^4$ is a $C_{5-12}$ alkyl group, or (ii) $R^1$ is a hydrogen atom, a halogen atom, an alkyl group or an alkoxy group, and at least one set of $R^2$ and $R^3$ and $R^4$ and $R^5$, is connected to form an alkylene group substituted by a lower alkyl group, provided that when they do not form the connecting group, one or $R^2$ and $R^5$ is a hydrogen atom, a halogen atom, an alkyl group or an alkoxy group, and one of $R^3$ and $R^4$ is an alkyl group; $R^6$ is a hydrogen atom, an alkyl group, an alkoxy group, an acyl group, or a cyano group, and $R^7$ is a heterocyclic group, having a total number of carbon atoms of from 3 to 17, which group is directly attached to the coumarin ring at the heterocyclic ring of said heterocyclic group, coated on a grained and anodized aluminum substrate.

2. The photosensitive lithographic printing plate according to claim 1, wherein in the formula (I), each of $R^3$ and $R^4$ is an alkyl group, provided that at least one of them is a $C_{5-12}$ alkyl group.

3. The photosensitive lithographic printing plate according to claim 2, wherein in the formula (I), each of $R^3$ and $R^4$ is an alkyl group, provided that one of them is a branched alkyl group and the other is a linear alkyl group.

4. The photosensitive lithographic printing plate according to claim 1, wherein in the formula (I), at least one set of $R^2$ and $R^3$, and $R^4$ and $R^5$ is connected to form an alkylene group substituted by a lower alkyl group.

5. The photosensitive lithographic printing plate according to claim 4, wherein the carbon number of the connecting chain of the alkylene group is 3.

6. The photosensitive lithographic printing plate according to claim 1, wherein in the formula (I), each of $R^1$, $R^2$, $R^5$ and $R^6$ is a hydrogen atom or a lower alkyl group, and $R^7$ is a nitrogen-containing fused aromatic heterocyclic group having a total number of carbon atoms of from 3 to 11.

7. The photosensitive lithographic printing plate according to claim 6, wherein component (a) is in an amount of from 0.2 to 40 wt. %, component (b) is in an amount of from 0.1 to 20 wt. %, and component (c) is in an amount of from 0.1 to 40 wt. % based on the addition polymerizable compound having at least one ethylenically unsaturated double bond.

8. The photosensitive lithographic printing plate according to claim 1, wherein the photopolymerization initiator system further contains (c) at least one member selected from the group consisting of compounds of the following formulas (II), (III) and (IV):

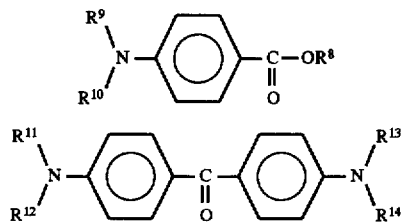

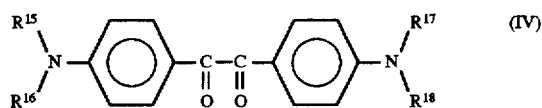

wherein each of $R^8$ to $R^{18}$ is an alkyl group.

9. The photosensitive lithographic printing plate according to claim 1, wherein the addition polymerizable compound having at least one ethylenically unsaturated double bond contains an acrylic acid ester or methacrylic acid ester of an aliphatic polyhydroxy compound.

10. The photosensitive lithographic printing plate according to claim 1, wherein component (a) is in an amount of from 0.2 to 40 wt. %, and component (b) is in an amount of from 0.1 to 20 wt. %, based on the addition polymerizable compound having at least one ethylenically unsaturated double bond.

* * * * *